(12) United States Patent
Lee et al.

(10) Patent No.: US 8,647,903 B2
(45) Date of Patent: Feb. 11, 2014

(54) METHOD OF FABRICATING ANTIREFLECTIVE GRATING PATTERN AND METHOD OF FABRICATING OPTICAL DEVICE INTEGRATED WITH ANTIREFLECTIVE GRATING PATTERN

(75) Inventors: Yong Tak Lee, Gwangju (KR); Young Min Song, Gwangju (KR)

(73) Assignee: Gwangju Institute of Science and Technology, Gwangju (KR)

( * ) Notice: Subject to any disclaimer, the term of this patent is extended or adjusted under 35 U.S.C. 154(b) by 0 days.

(21) Appl. No.: 12/999,148

(22) PCT Filed: Dec. 22, 2009

(86) PCT No.: PCT/KR2009/007673
§ 371 (c)(1),
(2), (4) Date: Dec. 15, 2010

(87) PCT Pub. No.: WO2010/074486
PCT Pub. Date: Jul. 1, 2010

(65) Prior Publication Data
US 2011/0092007 A1    Apr. 21, 2011

(30) Foreign Application Priority Data

Dec. 24, 2008 (KR) .................. 10-2008-0133583

(51) Int. Cl.
*H01L 21/00* (2006.01)
(52) U.S. Cl.
USPC .............................. 438/32; 257/96; 257/436
(58) Field of Classification Search
USPC ............................................ 135/255; 438/32
See application file for complete search history.

(56) References Cited

U.S. PATENT DOCUMENTS

| | | | | |
|---|---|---|---|---|
| 4,013,465 A | * | 3/1977 | Clapham et al. | 430/11 |
| 5,665,607 A | * | 9/1997 | Kawama et al. | 438/64 |
| 5,851,310 A | * | 12/1998 | Freundlich et al. | 136/255 |
| 6,495,862 B1 | * | 12/2002 | Okazaki et al. | 257/103 |

(Continued)

FOREIGN PATENT DOCUMENTS

| | | |
|---|---|---|
| JP | 08313706 A | 11/1996 |
| KR | 100741306 B1 | 7/2007 |

OTHER PUBLICATIONS

Kanamori et al., "Broadband Antireflection Gratings for Glass Substrates Fabricated by Fast Atom Beam Etching," Jpn. J. Appl. Phys. Jul. 15, 2000, pp. L735-L737, vol. 39.

(Continued)

*Primary Examiner* — Michael Lebentritt
*Assistant Examiner* — Aaron Dehne
(74) *Attorney, Agent, or Firm* — The Webb Law Firm

(57) ABSTRACT

A method of fabricating an antireflective grating pattern and a method of fabricating an optical device integrated with an antireflective grating pattern are provided. The method of fabricating the antireflective grating pattern includes forming a photoresist (PR) pattern on a substrate using a hologram lithography process, forming a PR lens pattern having a predetermined radius of curvature by reflowing the PR pattern, and etching the entire surface of the substrate including the PR lens pattern to form a wedge-type or parabola-type antireflective subwavelength grating (SWG) pattern having a pointed tip on a top surface of the substrate. In this method, a fabrication process is simplified, the reflection of light caused by a difference in refractive index between the air and a semiconductor material can be minimized, and the antireflective grating pattern can be easily applied to optical devices.

7 Claims, 14 Drawing Sheets

(56) References Cited

U.S. PATENT DOCUMENTS

| | | | |
|---|---|---|---|
| 2002/0000244 A1* | 1/2002 | Zaidi | 136/259 |
| 2004/0045598 A1* | 3/2004 | Narayanan et al. | 136/255 |
| 2006/0270074 A1* | 11/2006 | Kim | 438/22 |

OTHER PUBLICATIONS

Kintaka et al., "Antireflection microstructures fabricated upon fluorine-doped SiO2 films," Optics Letters, Nov. 1, 2001, pp. 1642-1644, vol. 26, No. 21.

Brundrett et al., "Polarizing mirror/absorber for visible wavelengths based on a silicon subwavelength grating: design and fabrication," Applied Optics, May 1, 1998, pp. 2534-2541, vol. 37, No. 13.

Sun et al., "Templated fabrication of large area subwavelength antireflection gratings on silicon," Applied Physics Letters, 2007, pp. 231105-1-231105-3, 91.

Yu et al., "Fabrication of large area subwavelength antireflection structures on Si using trilayer resist nanoimprint lithography and liftoff," J. Vac. Sci. Technol.B., Nov./Dec. 2003, pp. 2874-2877, 21(6).

Huang et al., "Improved broadband and quasi-omnidirectional antireflection properties with biomimetic silicon nanostructures," nature nanotechnology, Dec. 2007, pp. 770-774, vol. 2.

Feng et al., "Design of Highly Efficient Light-Trapping Structures for Thin-Film Crystalline Silicon Solar Cells," IEEE Transactions on Electron Devices, Aug. 2007, pp. 1926-1933, vol. 54, No. 8.

Ren et al., "Complex diamond lattice with wide band gaps in the visible range prepared by holography using a material with a low index of refraction," Physical Review B, 2007, pp. 035120-1-035120-6, 76(3).

Gombert et al., "Antireflective Transparent Covers for Solar Devices," Solar Energy, 2000, pp. 357-360, vol. 68, No. 4.

* cited by examiner

Hologram exposure

METHOD OF FABRICATING ANTIREFLECTIVE GRATING PATTERN AND METHOD OF FABRICATING OPTICAL DEVICE INTEGRATED WITH ANTIREFLECTIVE GRATING PATTERN

CROSS-REFERENCE TO RELATED APPLICATION

This application claims priority to and the benefit of Korean Patent Application No. 10-2008-133583, filed on Dec. 24, 2008, the disclosure of which is incorporated herein by reference in its entirety.

BACKGROUND

1. Field of the Invention

The present invention relates to a method of fabricating an antireflective grating pattern and a method of fabricating an optical device integrated with an antireflective grating pattern, and more particularly, to a method of fabricating an antireflective grating pattern and a method of fabricating an optical device integrated with an antireflective grating pattern in which a wedge-type or parabola-type antireflective subwavelength grating (SWG) pattern having a pointed tip is formed on a semiconductor substrate using a hologram lithography process, a reflow process, and a pattern transfer process to minimize the reflected amount of light caused by a difference in refractive index between the air and a semiconductor material.

2. Discussion of Related Art

In general, reducing the reflected amount of light between two media having different refractive indices is an important problem to be solved in terms of optical devices, such as solar cells, photodetectors, light emitting diodes, or transparent glasses.

FIG. 1 is a conceptual diagram for explaining the reflection and transmission of light when the light is vertically incident on a medium.

Referring to FIG. 1, the reflection of light is determined by a Fresnel equation. Assuming that light is vertically incident on a medium, a reflected amount R is expressed by the following equation 1:

$$R = \left(\frac{n_1 - n_2}{n_1 + n_2}\right)^2, \quad (1)$$

wherein $n_1$ and $n_2$ refer to the refractive indices of media. Since a semiconductor material (e.g., silicon (Si) or gallium arsenide (GaAs)) applied to a semiconductor substrate of an optical device has a refractive index $n_2$ of about 3 to 4 and the air has a refractive index $n_1$ of 1, when light is incident from the air on the optical device, about 30% or more of the light may be reflected. Also, when light is emitted from the optical device into the air, similar loss may be generated.

The reflection of the light may be a main cause for a reduction in the efficiency of the optical device. An antireflective coating (ARC) method may be typically used to reduce the reflection of light. The ARC method may include depositing a material, such as a dielectric material or a polymer material, which has a lower refractive index than a semiconductor to reduce the reflection of the light.

According to the ARC method, while minimum reflection characteristics may be obtained in a specific wavelength range by appropriately controlling a refractive index and an optical thickness, it may be difficult to find materials appropriate for various semiconductor materials, to consider electrical and thermal properties, and to reduce the reflection of light over a wide spectrum and there may be a great difference in reflectance according to an incident angle of light.

Meanwhile, research has recently been conducted on a method of reducing the reflection of light using a subwavelength grating (SWG) structure, which is based on the following principle. An incident angle according to the grating order of the grating structure is expressed by Equation 2:

$$\sin\theta_m = \frac{m\lambda}{\Lambda n_2} + \frac{n_1}{n_2}\sin\theta_i, \quad (2)$$

wherein m denotes the grating order, $\lambda$ denotes a wavelength of incident light, $\Lambda$ denotes a period of the grating structure, and $n_1$ and $n_2$ denote refractive indices of media.

When the period $\Lambda$ of the grating structure is much less than the wavelength $\lambda$ of the incident light, the grating order m can only be 0. In other words, no light is diffracted in a lateral direction. In this case, according to the effective medium theory, the refractive index of the grating structure may be regarded as an effective refractive index in proportion to a fill factor of the grating structure.

For example, when a grating structure having a fill factor of 0.5 is formed using a material having a refractive index of 3, since the refractive index of the air is 1, the effective refractive index becomes 2 according to the equation: (3*0.5+1*0.5)/2. When the grating structure is formed in a cone or pyramid shape rather than a simple rod or ridge shape, a refractive index may be gradually varied from a semiconductor toward the air, and thus the reflection of light may be hardly eliminated.

Meanwhile, conventional methods of fabricating SWG structures include 1) a method of forming a subwavelength pattern using an electron beam (e-beam) lithography process or hologram lithography process and forming a grating structure in a cone shape using a dry etching process or wet etching process (Reference document: Y. Kanamori et. al., Jpn. J. Appl. Phys. 39, L735 (2000), K. Kintaka et. al., Opt. Lett. 26, 1642 (2001), D. L. Brundrett et. al., Appl. Opt. 37, 2534 (1998)), 2) a method of fabricating a pyramidal grating structure using colloidal crystals (Reference document: C. Sun et. al., Appl. Phys. Lett. 91, 231105 (2007)), 3) a method of fabricating a grating structure using nano-imprint and lift-off processes (Reference document: Z. Yu et. al., J. Vac. Sci. Technol. B21, 2874 (2003)), and 4) a method of fabricating an SWG structure using a self-masked etching process (Reference document: Y. Huang et. al., Nat. Nanotechnol. 2, 770 (2007)). However, the above-described conventional methods involve performing complicated processes or employing complicated gas mixtures and preclude forming aligned structures.

In addition, the following two points should be considered during the fabrication of an antireflective SWG structure. First, the packing density of the antireflective SWG structure should be increased. Second, the height and period of the grating structure should be controllable.

When the packing density of the antireflective SWG structure is low, since a difference in refractive index between a semiconductor and the grating structure is great, the reflection of light may be increased. Also, it should be capable of controlling the height and period of the grating structure to control the reflectance of light in a desired wavelength.

SUMMARY OF THE INVENTION

In order to solve the foregoing and/or other problems, it is an object of the present invention to provide a method of fabricating an antireflective grating pattern and a method of fabricating an optical device integrated with an antireflective grating pattern in which a wedge-type or parabola-type antireflective subwavelength grating (SWG) pattern having a pointed tip is foamed on a semiconductor substrate using a hologram lithography process, a reflow process, and a pattern transfer process to minimize the reflected amount of light caused by a difference in refractive index between the air and a semiconductor material.

It is another object of the present invention to provide to a method of fabricating an antireflective grating pattern and a method of fabricating an optical device integrated with an antireflective grating pattern in which an antireflective SWG structure having a high packing density and capable of controlling the height and period may be fabricated and an optical device may be integrated with the fabricated grating structure.

According to a first aspect of the present invention, there is provided a method of fabricating an antireflective grating pattern, including: forming a photoresist (PR) pattern on a substrate using a hologram lithography process; forming a PR lens pattern having a predetermined radius of curvature by reflowing the PR pattern; and etching the entire surface of the substrate including the PR lens pattern to form a wedge-type or parabola-type antireflective SWG pattern having a pointed tip on a top surface of the substrate.

The formation of the PR pattern may include primarily exposing a PR layer formed on the substrate with light having a photonic crystal pattern, secondarily exposing the PR layer by rotating the substrate 90 degrees, masking a portion of the PR layer where the PR pattern will be formed using a photomask, and exposing and developing the PR layer to form a 2-dimensional grating structure pattern in a desired portion of the PR layer.

A period of the photonic crystal pattern may be determined by at least one condition of a wavelength of a light source, a grating order, and an angle of incident light.

2-dimensional grating structure patterns having various shapes may be formed by controlling a rotation angle of the substrate to be in the range of about 0 to 90 degrees.

The radius of curvature and packing density of the PR lens pattern may be controlled by adjusting a heating temperature or heating time during the reflowing of the PR pattern.

The reflowing of the PR pattern may be performed at a temperature of about 120 to 400° C.

The antireflective grating pattern may be formed using a plasma dry etching process.

The height of the antireflective grating pattern may be controlled by adjusting at least one condition of a gas amount, a pressure, and a driving voltage during the plasma dry etching process to obtain a desired aspect ratio.

The substrate may be made of transparent glass.

According to a second aspect of the present invention, there is provided a method of fabricating an optical device integrated with an antireflective grating pattern, including: sequentially stacking an n-type doping layer, an active layer, and a p-type doping layer, stacking a p-type upper electrode on a top surface of the p-type doping layer except an emission portion, and stacking an n-type lower electrode on a bottom surface of the n-type doping layer; and forming a wedge-type or parabola-type antireflective SWG pattern having a pointed tip on a top surface of the emission portion of the p-type doping layer.

According to a third aspect of the present invention, there is provided a method of fabricating an optical device integrated with an antireflective grating pattern, including: sequentially stacking an n-type doping layer, an active layer, and a p-type doping layer and forming a wedge-type or parabola-type antireflective SWG pattern having a pointed tip on a top surface of an emission portion of the p-type doping layer; and stacking a transparent electrode on the entire surface of the p-type doping layer including the antireflective grating pattern, stacking a contact pad on a top surface of the transparent electrode except the emission portion, and stacking an n-type lower electrode on a bottom surface of the n-type doping layer.

According to a fourth aspect of the present invention, there is provided a method of fabricating an optical device integrated with an antireflective grating pattern, including: sequentially stacking a bottom cell layer, a middle cell layer, and a top cell layer, stacking a p-type upper electrode on a top surface of one side of the top cell layer, and stacking an n-type lower electrode on a bottom surface of the bottom cell layer; and forming a wedge-type or parabola-type antireflective SWG pattern having a pointed tip on a top surface of the top cell layer except a region of the p-type upper electrode.

The bottom cell layer and the middle cell layer may be connected to each other by a first tunnel junction layer, and the middle cell layer and the top cell layer may be connected to each other by a second tunnel junction layer.

The method may further include a buffer layer disposed between the first tunnel junction layer and the middle cell layer.

According to a fifth aspect of the present invention, there is provided a method of fabricating an optical device integrated with an antireflective grating pattern, including: sequentially stacking an n-type doping layer, a light absorption layer, and a p-type doing layer, stacking a p-type upper electrode on a top surface of the p-type doping layer except a light absorption portion, and stacking an n-type lower electrode on a bottom surface of the n-type doping layer; and forming a wedge-type or parabola-type antireflective SWG pattern having a pointed tip on a top surface of the light absorption portion of the p-type doping layer.

According to a sixth aspect of the present invention, there is provided a method of fabricating an optical device integrated with an antireflective grating pattern, including: stacking an upper electrode on a top surface of one side of a crystalline silicon layer and stacking a reflective layer on a bottom surface of the crystalline silicon layer; and forming a wedge-type or parabola-type antireflective SWG pattern having a pointed tip on a top surface of the crystalline silicon layer except a region of the upper electrode.

Each of the period and depth of the antireflective grating pattern may range from about 300 to 500 nm.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to one skilled in the art.

Embodiment 1

FIGS. 2 through 5 are cross-sectional views illustrating a method of fabricating an antireflective grating pattern according to a first exemplary embodiment of the present invention.

Figure 1:
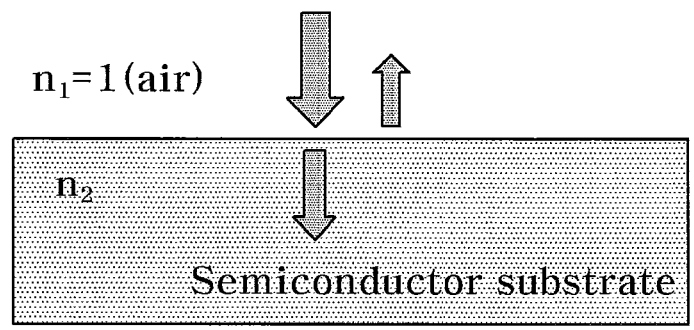
FIG. 1 is a conceptual diagram for explaining the reflection and transmission of light when light is vertically incident on a medium.
Figure 2:
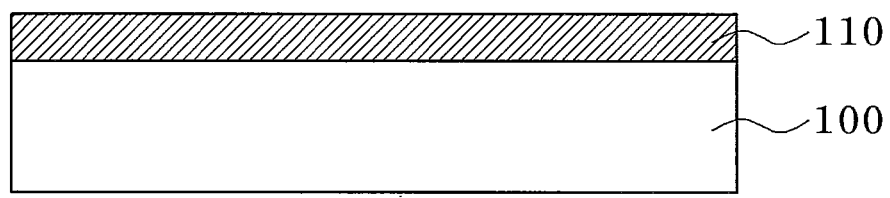
FIGS. 2 through 5 are cross-sectional views illustrating a method of fabricating an antireflective grating pattern according to a first exemplary embodiment of the present invention.
Figure 3:
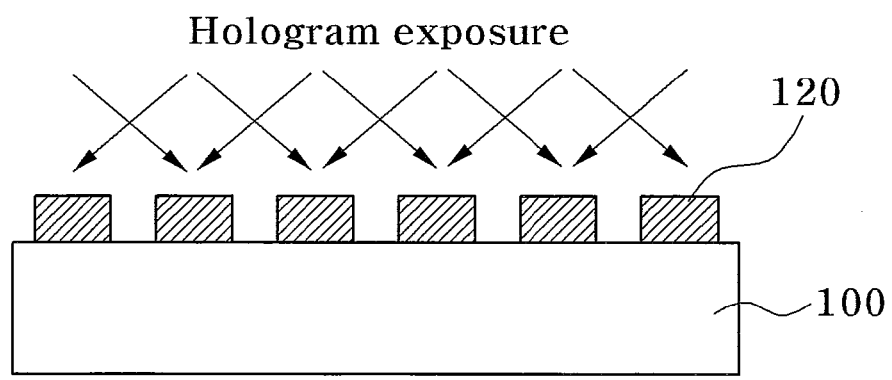

Referring to FIGS. 2 and 3, a photoresist (PR) layer 110 may be coated on a top surface of a previously prepared substrate 100, and a periodically arranged PR photonic crystal pattern 120 may be formed on the top surface of the substrate 100 using, for example, light having a photonic crystal pattern such that the PR photonic crystal pattern 120 has a subwavelength period.

Here, although the substrate 100 may be, for example, a semiconductor substrate (e.g., a GaAs substrate or an InP substrate), the present invention is not limited thereto, and the substrate 100 may be any other substrate (e.g., transparent glass) on which the PR layer 110 may be coated.

In addition, the light having the photonic pattern may be formed using, for example, a laser hologram, but the present invention is not limited thereto and the light having the photonic pattern may be formed using a nano-imprint technique or an e-beam lithography technique. However, a hologram lithography technique may be advantageous for commercialization because the light having the photonic crystal pattern may be formed at low cost using a simple process.

The laser hologram refers to a periodic interference pattern formed by allowing at least two laser beams having a path difference to meet one another.

In this case, the period of the interference pattern may be determined depending on at least one condition of, for example, a wavelength of a light source, a grading order, and an angle of incident light.

Here, the laser hologram is primarily exposed to form a 1-dimensional grating structure pattern. Subsequently, the substrate 100 is rotated 90 degrees, and the 1-dimensional grating structure pattern is secondarily exposed to form a 2-dimensional grating structure pattern. By appropriately controlling a rotation angle of the substrate 100 to be in the range of 0 to 90 degrees, 2-dimensional grating structure patterns having various shapes, that is, PR photonic crystal patterns 120, may be fabricated.

Specifically, the fabrication of the PR photonic crystal patterns 120 may include primarily exposing the PR layer 110 formed on the substrate 100 with the light having the photonic crystal pattern, secondarily exposing the PR layer 110 by rotating the substrate 100 90 degrees, masking a portion of the PR layer 110 where the PR photonic crystal pattern 120 will be formed using a predetermined photomask, exposing the PR layer 110 with ultraviolet (UV) light, and developing the exposed PR layer 110 to form a 2-dimensional grating structure pattern on a desired portion of the developed PR layer 110.

Figure 4:
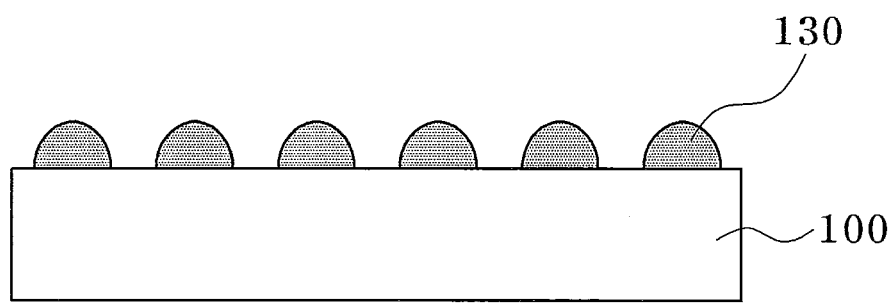

Referring to FIG. 4, the PR photonic crystal pattern 120 formed on the top surface of the substrate 100 may be heated to a predetermined temperature and reflowed, thereby forming a nano-lens array having a predetermined radius of curvature, that is, a PR lens pattern 130.

In this case, the PR photonic crystal pattern 120 may be reflowed by applying heat at a temperature of, for example, about 120 to 400° C., specifically, about 200° C., above a glass transition temperature. Due to the reflow process, the PR lens pattern 130 having a predetermined radius of curvature corresponding to, for example, a nanoscale radius of curvature, may be formed on the top surface of the substrate 100.

Figure 5:
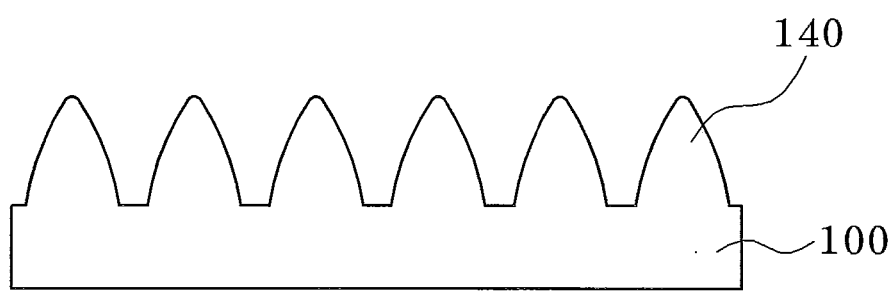

Meanwhile, by appropriately controlling a heating temperature or heating time during the reflow of the PR photonic crystal pattern 120, the radius of curvature of the PR lens pattern 130 may be easily controlled. In particular, the packing density of the antireflective grating pattern may be increased. Referring to FIG. 5, a dry etching process may be performed on the entire surface of the substrate 100 including the PR lens pattern 130 so that a subwavelength antireflective grating pattern 140 having a predetermined period of, specifically, about 200 to 400 nm, and a depth of, specifically, about 200 to 600 nm, can be formed on the top surface of the substrate 100.

The antireflective grating pattern 140 may be periodically and regularly arranged on the surface of the substrate 100. Although the antireflective grating pattern 140 may have a tip-pointed wedge shape, for example, a cone shape whose cross section is narrowed from the surface of the substrate 100 to an air layer thereon, the present invention is not limited thereto. For example, the antireflective grating pattern 140 may have a parabolic shape, a triangular pyramidal shape, a quadrangular pyramidal shape, or a polygonal pyramidal shape.

Meanwhile, although the dry etching process may be a plasma dry etching process, the present invention is not limited thereto. The dry etching process may be a dry etching process using both a reactive gas and plasma to improve anisotropic etching characteristics and an etch rate, for example, a reactive ion etching (RIE) process in which plasma is generated by radio-frequency (RF) power or an inductively coupled plasma (ICP) etching process.

Meanwhile, the height of the antireflective grating structure may be controlled by adjusting, for example, a gas amount, a pressure, and a driving voltage during the dry etching process so that a desired aspect ratio can be easily obtained.

Figure 6:
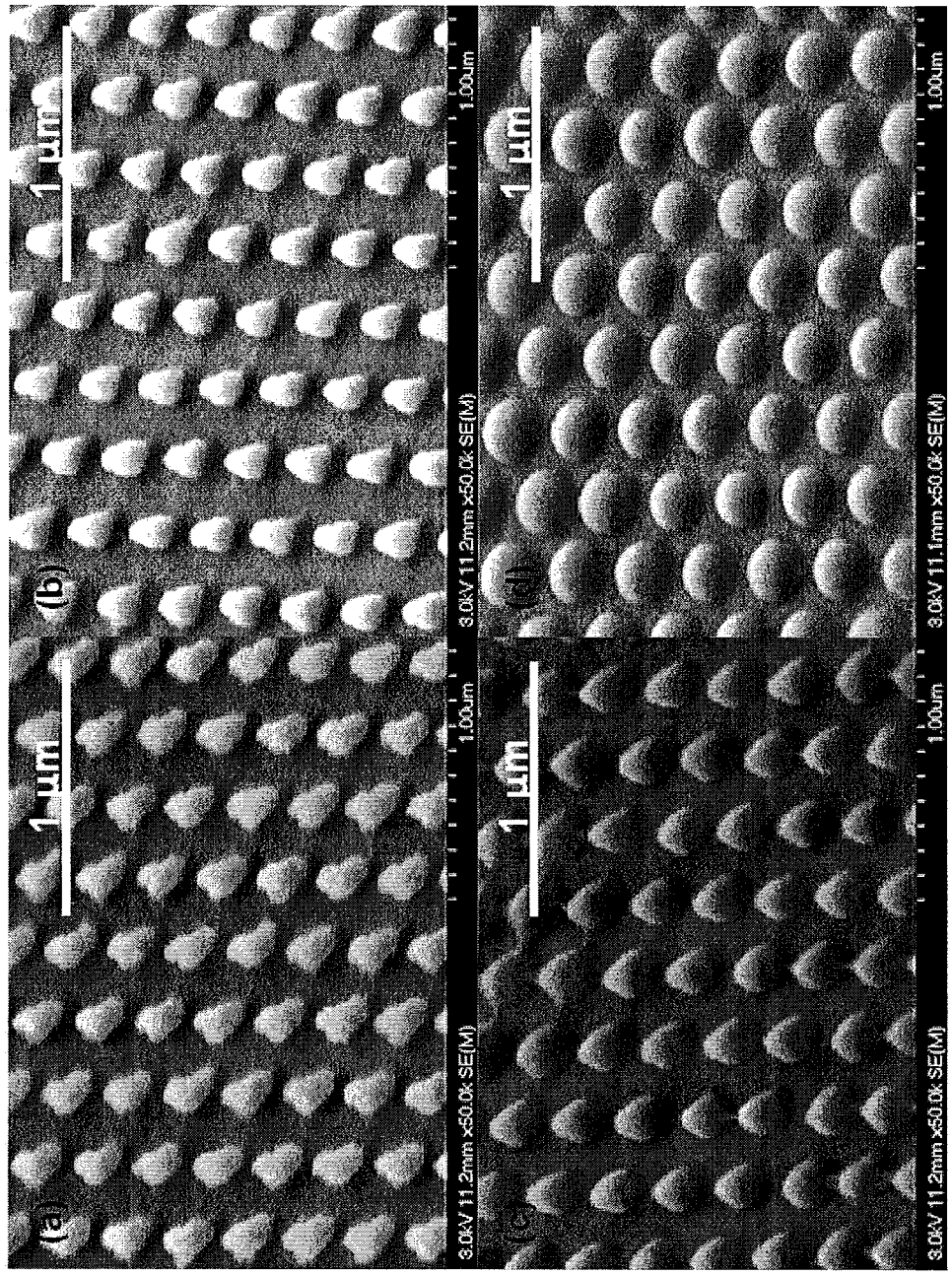
FIGS. 6A through 6D are scanning electron microscope (SEM) images of a photoresist (PR) photonic crystal pattern having a subwavelength pattern fabricated according to the first exemplary embodiment of the present invention and reflowed PR layers.

FIGS. 6A through 6D are scanning electron microscope (SEM) images of the PR photonic crystal pattern having a subwavelength pattern fabricated according to the first exemplary embodiment of the present invention and the reflowed PR layers. FIG. 6A is a SEM image of the PR photonic crystal pattern (refer to 120 in FIG. 3) having a subwavelength pattern foamed using a laser hologram, and FIGS. 6B through 6D are SEM images of PR layers formed by changing a heating temperature to about 160 degrees, 180 degrees, and 200 degrees, respectively.

In FIGS. 6B through 6D, a heating time of about 40 seconds was maintained. As can be seen from FIG. 6D, when heat was applied at a temperature of about 200° C. for 40 seconds, a semispherical lens shape was obtained, and a packing density was much higher than before the heat was applied.

Figure 7:
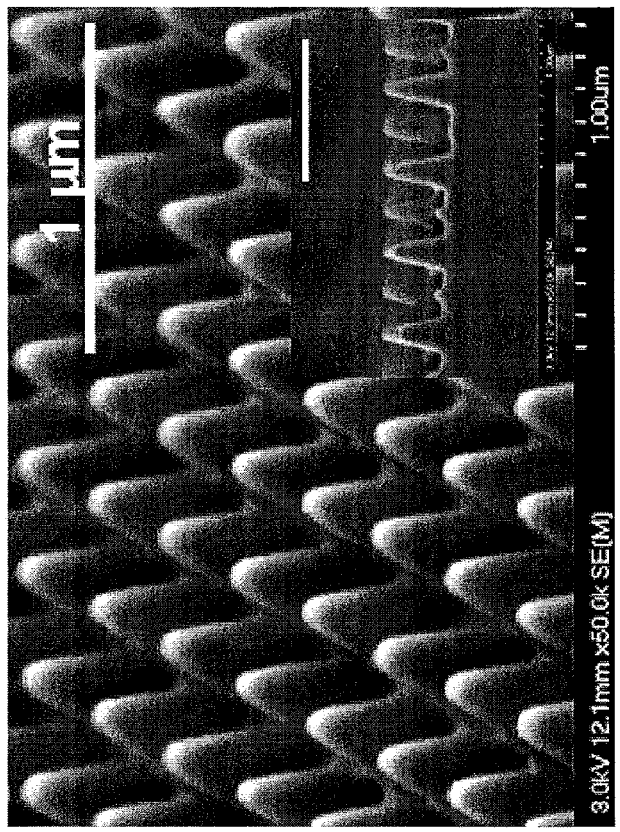
FIGS. 7A and 7B are SEM images showing variations in the period and depth of antireflective grating patterns applied to the first exemplary embodiment of the present invention.
Figure 7:
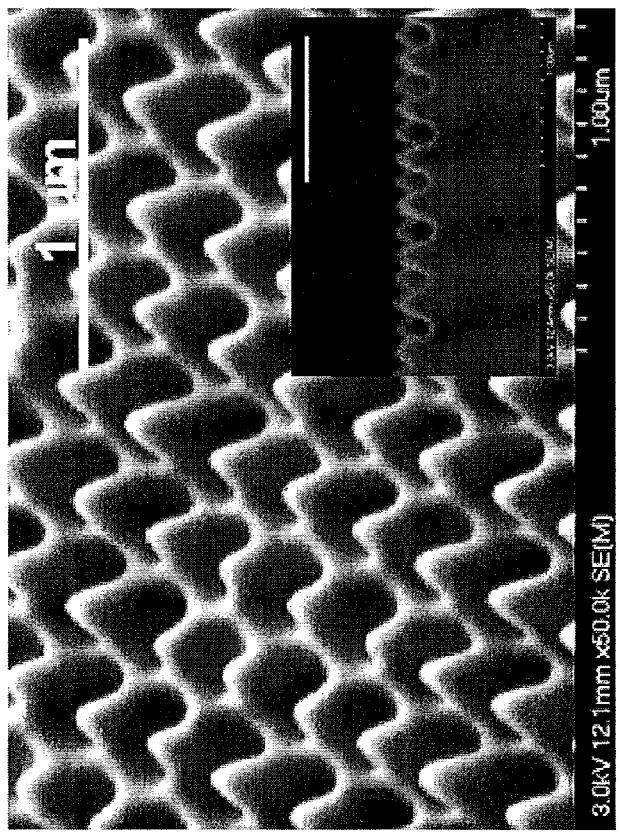

FIGS. 7A and 7B are SEM images showing variations in the period and depth of antireflective grating patterns applied to the first exemplary embodiment of the present invention. Inner diagrams of FIGS. 7A and 7B are cross-sectional views of the antireflective grating patterns obtained using an ICP-RIE process by supplying SiCl$_4$ gas and Ar gas in a ratio of 7.5 seem to 60 seem under a pressure of about 2 mTorr.

FIG. 7A is a SEM image of the antireflective grating pattern obtained by performing a dry etching process for about 15 minutes while applying an RF power of about 130 W. From FIG. 7A, it can be confirmed that the antireflective grating pattern 140 had a period of about 300 nm and a depth of about 250 nm.

FIG. 7B is a SEM image of the antireflective grating pattern obtained by performing a dry etching process for about 10 minutes while applying an RF power of about 100 W. From FIG. 7B, it can be confirmed that the antireflective grating pattern 140 had a period of 300 nm and a depth of about 400 nm.

That is, in view of the fact that grating structures of FIGS. 7A and 7B have the same grating period and packing density and different grating heights, it can be seen that a grating structure may be formed to a desired grating height by controlling RF power.

Figure 8:
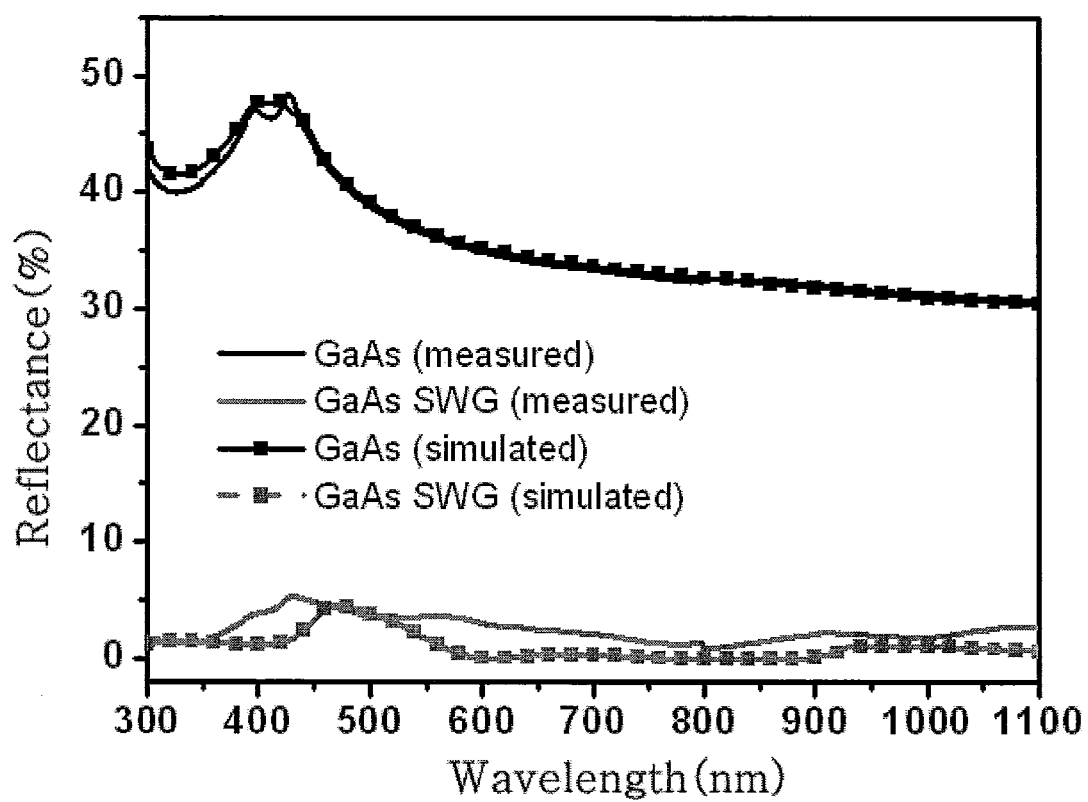
FIG. 8 is a graph showing reflectance versus wavelength in the antireflective grating pattern according to the first exemplary embodiment of the present invention.

FIG. 8 is a graph showing reflectance versus wavelength in the antireflective grating pattern according to the first exemplary embodiment of the present invention, which shows measured and simulated results of the reflectances of a sample in which a GaAs substrate serving as a semiconductor substrate is provided and a sample in which an antireflective grating pattern is formed on a GaAs substrate. The reflectances of the samples were measured using a UV-VIS-NIR spectrophotometer and calculated using rigorous coupled-wave analysis (RCWA).

Referring to FIG. 8, the GaAs substrate exhibited a reflectance of about 30 to 47% according to a wavelength range because the reflective index of the sample ranged from about 3.5 to 5.1 according to the wavelength range. In contrast, when the antireflective grating pattern (refer to 140 in FIG. 5) was formed on the GaAs substrate, it could be confirmed that the sample exhibited a reflectance of about 5% or less in a wavelength range of about 300 to 1100 nm, which was almost equal to the simulated value.

Figure 9:
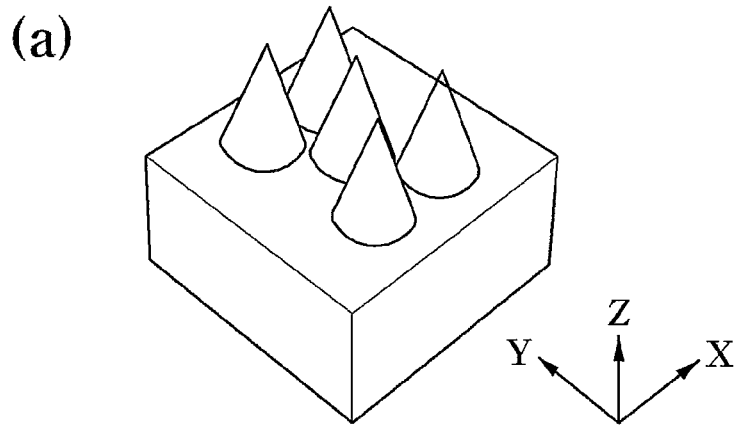
FIGS. 9A and 9B are diagrams showing variations in period and depth according to the shape of the antireflective grating pattern according to the first exemplary embodiment of the present invention.
Figure 9:
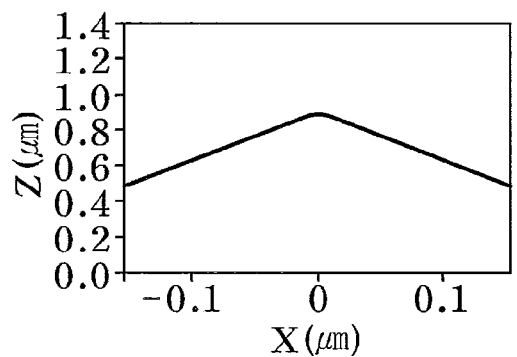
Figure 9:
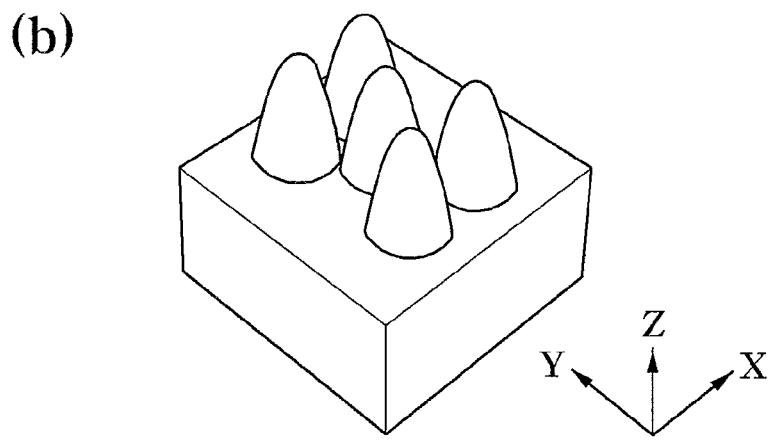
Figure 9:
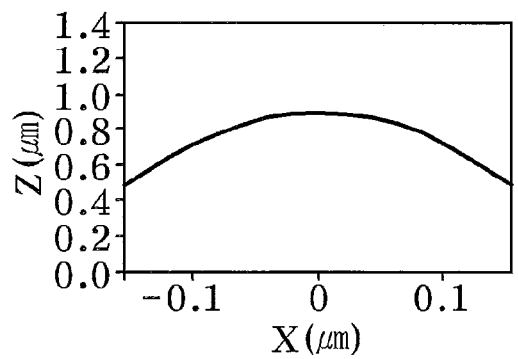

FIGS. 9A and 9B are diagrams showing variations in period and depth according to the shape of the antireflective grating pattern according to the first exemplary embodiment of the present invention. FIG. 9A shows a cone-type antireflective grating pattern having a linear profile, and FIG. 9B shows a parabola-type antireflective grating pattern having a quadratic profile.

Figure 10:
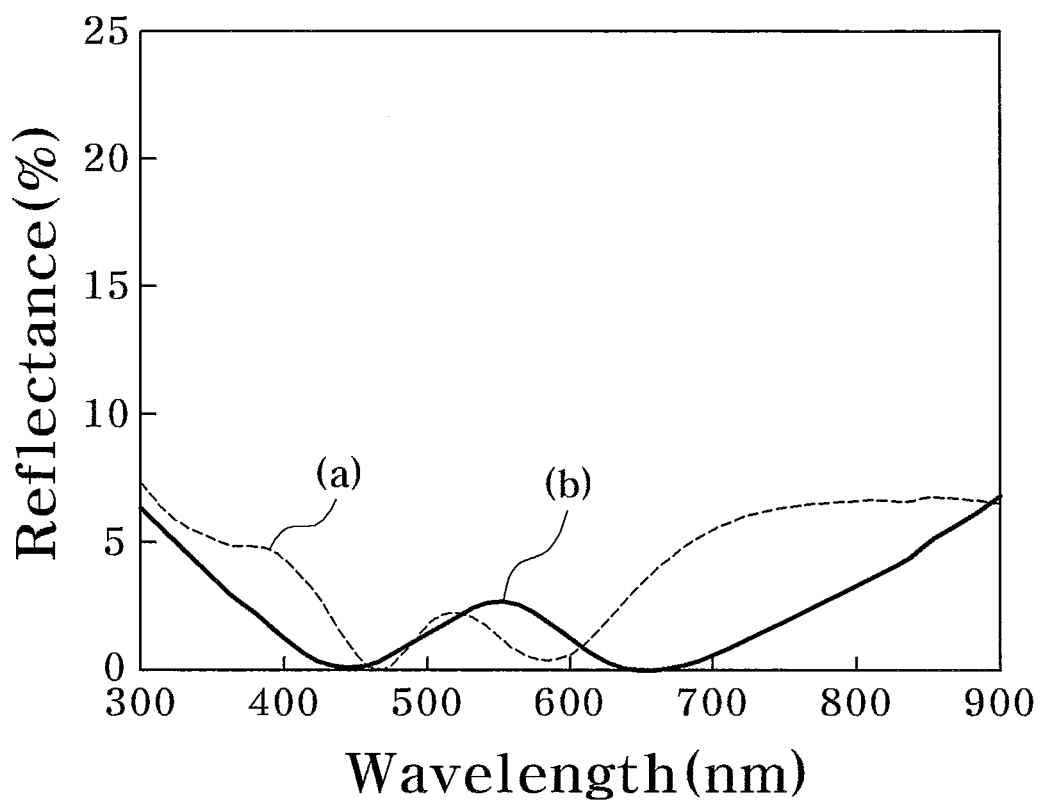
FIG. 10 is a graph showing reflectance versus wavelength in the antireflective grating patterns of FIGS. 9A and 9B.

FIG. 10 is a graph showing reflectance versus wavelength in the antireflective grating patterns of FIGS. 9A and 9B. The parabola-type antireflective grating pattern may obtain a much higher reflectance than the cone-type antireflective grating pattern. That is, the parabola-type antireflective grating pattern may obtain an average reflectance of about 2.037% in a wavelength range of about 300 to 900 nm, which is about half or less than the average reflectance (about 4.841%) of the cone-type antireflective grating pattern. In this case, the antireflective grating pattern may be formed to a depth of about 300 nm.

Figure 11:
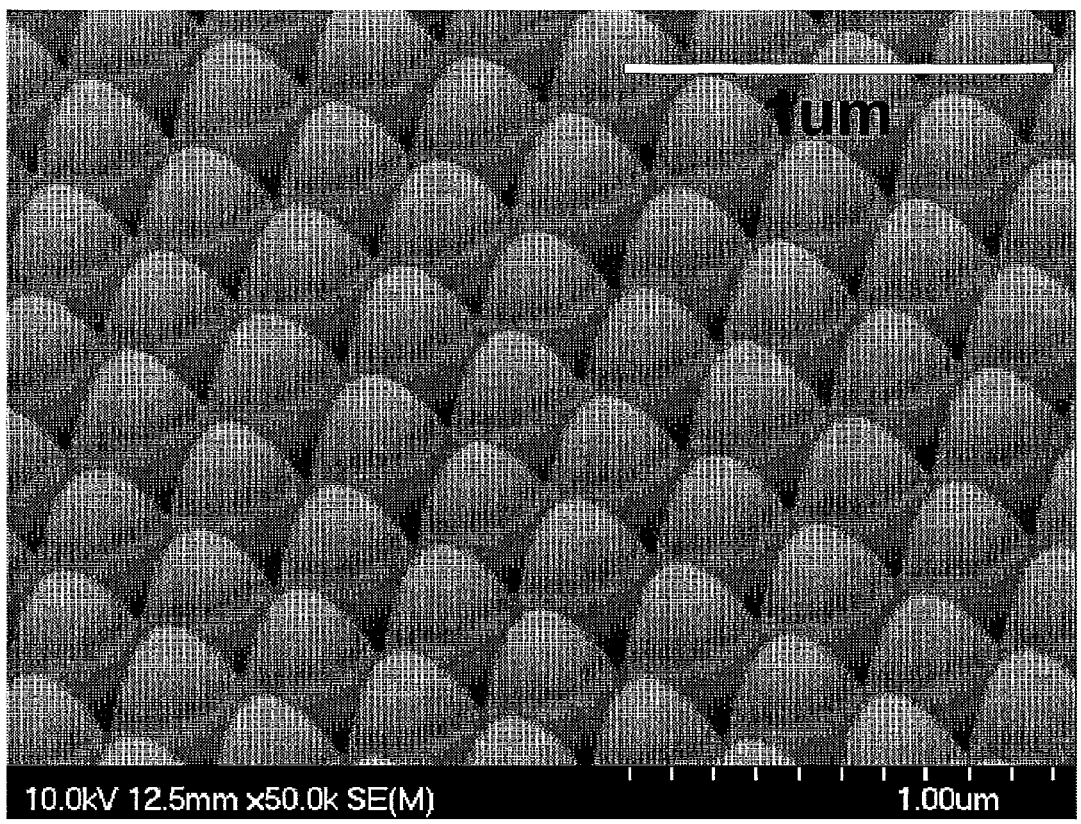
FIG. 11 is a SEM image showing variations in period and depth of the parabola-type antireflective grating pattern applied to the first exemplary embodiment of the present invention.
Figure 12:
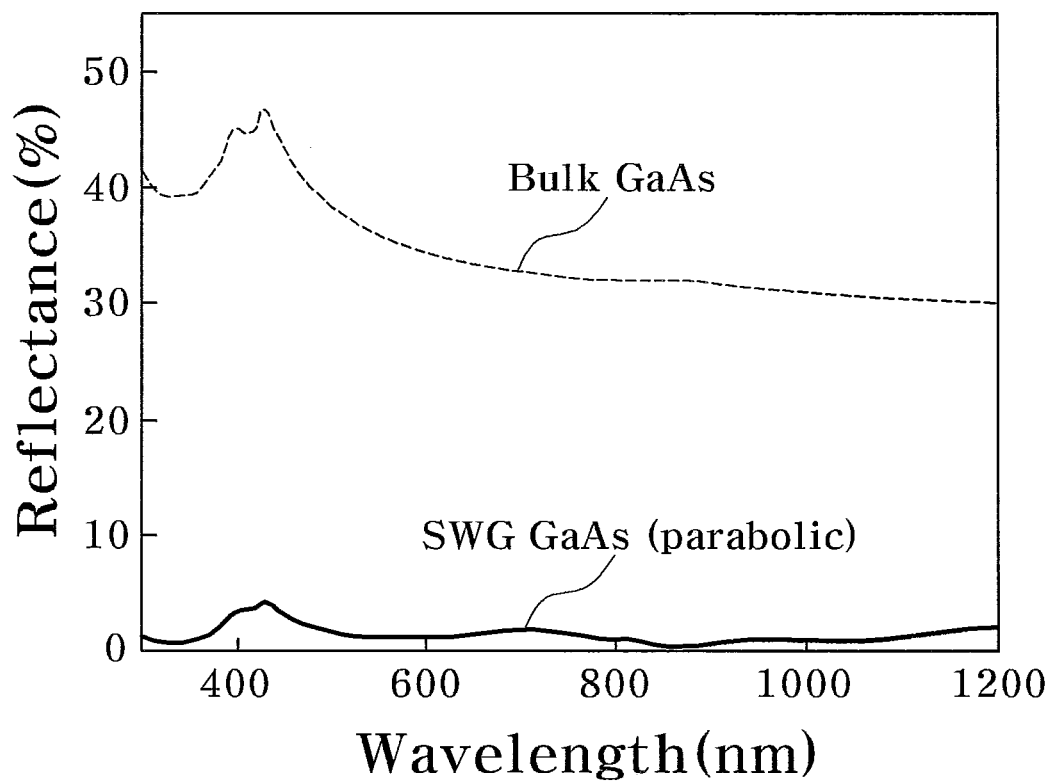
FIG. 12 is a graph showing reflectance versus wavelength in the parabola-type antireflective grating pattern of FIG. 11.

FIG. 11 is a SEM image showing variations in period and depth of the parabola-type antireflective grating pattern applied to the first exemplary embodiment of the present invention, and FIG. 12 is a graph showing reflectance versus wavelength in the parabola-type antireflective grating pattern of FIG. 11. The parabola-type antireflective grating pattern may be formed by controlling process conditions. As shown in FIG. 11, the parabola-type antireflective grating pattern may be obtained by performing an etching process under a pressure of about 50 mTorr for about 8 minutes.

As shown in FIG. 12, comparing a typical bulk GaAs substrate and a GaAs substrate (SWG GaAs) having a parabola-type antireflective grating pattern, the typical bulk GaAs substrate exhibits a reflectance of about 46% or lower in a wavelength range of about 300 to 1200 nm, and the GaAs substrate (SWG GaAs) having the parabola-type antireflective grating pattern exhibits a reflectance of about 5% or lower, which is far lower than that of the bulk GaAs substrate.

Embodiment 2

Figure 13:
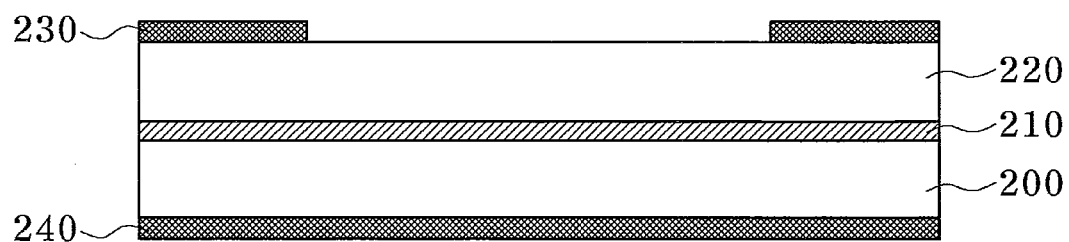
FIGS. 13 and 14 are cross-sectional views illustrating a method of fabricating an optical device integrated with an antireflective grating pattern according to a second exemplary embodiment of the present invention.
Figure 14:
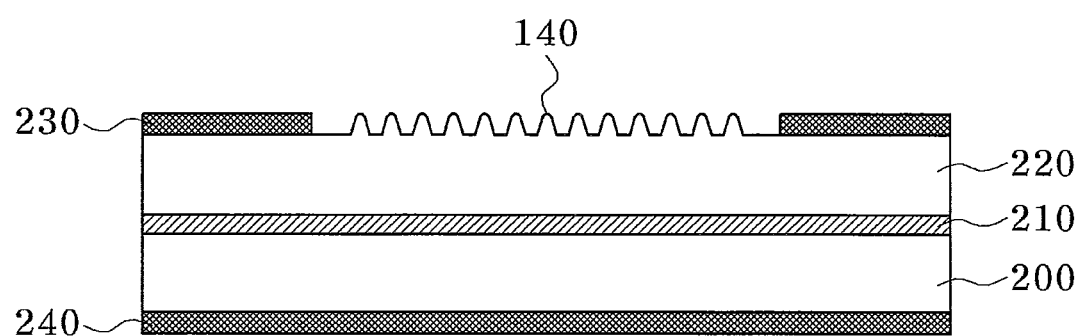

FIGS. 13 and 14 are cross-sectional views illustrating a method of fabricating an optical device integrated with an antireflective grating pattern according to a second exemplary embodiment of the present invention.

Referring to FIG. 13, the optical device may have a structure of a typical light emitting device. For example, a method of fabricating the optical device may include sequentially stacking an n-type doping layer 200, an active layer 210, and a p-type doping layer 200, stacking a p-type upper electrode 230 on a top surface of the p-type doping layer 220 except an emission portion, and stacking an n-type lower electrode 240 on a bottom surface of the n-type doping layer 200, but the present invention is not limited thereto.

Referring to FIG. 14, the antireflective grating pattern 140 formed according to the first exemplary embodiment of the present invention may be integrated on a top surface of the emission portion of the p-type doping layer 220, thereby completing the fabrication of the optical device integrated with the antireflective grating pattern according to the second exemplary embodiment of the present invention.

In the present embodiment, since the method of forming the antireflective grating pattern 140 is the same as in the first embodiment of the present invention, a detailed description thereof will be omitted.

Embodiment 3

Figure 15:
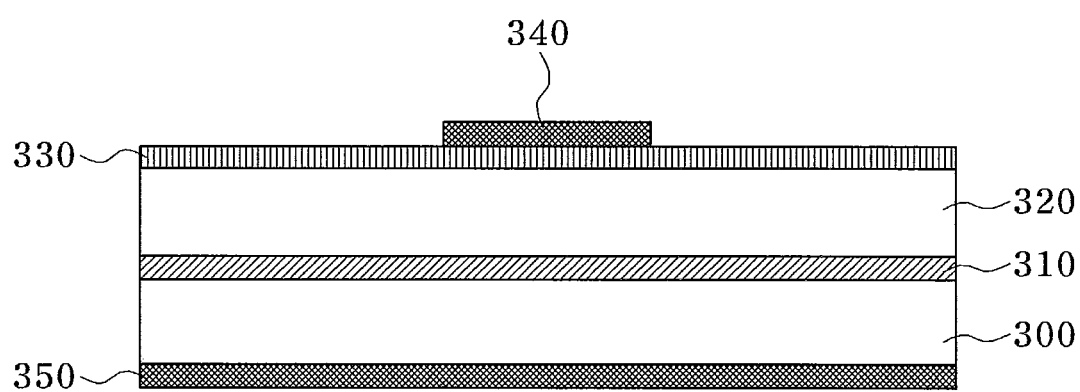
FIGS. 15 and 16 are cross-sectional views illustrating a method of fabricating an optical device integrated with an antireflective grating pattern according to a third exemplary embodiment of the present invention.
Figure 16:
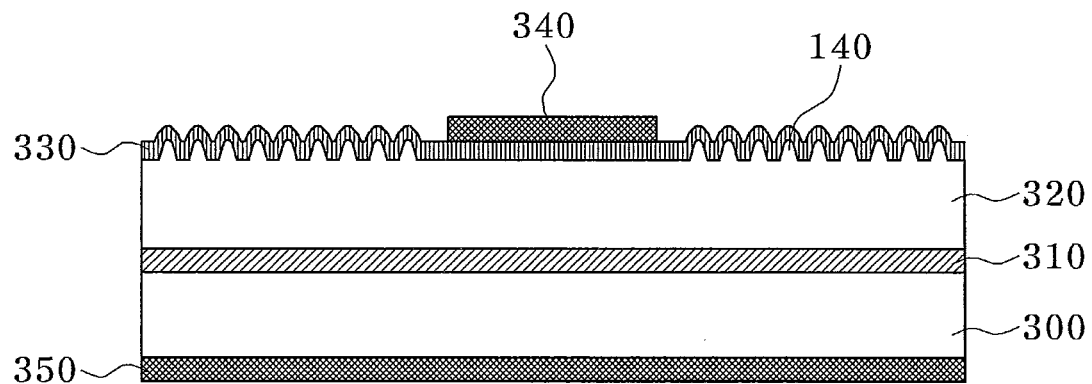

FIGS. 15 and 16 are cross-sectional views illustrating a method of fabricating an optical device integrated with an antireflective grating pattern according to a third exemplary embodiment of the present invention.

Referring to FIG. 15, the optical device may have a structure of a typical light emitting device. For example, the fabrication of the optical device may include sequentially stacking an n-type doping layer 300, an active layer 310, and a p-type doping layer 320, sequentially stacking a transparent electrode 330 and a contact pad 340 on the p-type doping layer 320, and stacking an n-type lower electrode 350 on a bottom surface of the n-type doping layer 300, but the present invention is not limited thereto.

Referring to FIG. 16, before stacking the transparent electrode 330, the antireflective grating pattern 140 formed according to the first exemplary embodiment of the present invention may be integrated on a top surface of the emission portion of the p-type doping layer 320, thereby completing the fabrication of the optical device integrated with the antireflective grating pattern according to the third exemplary embodiment of the present invention.

In the present embodiment, since the method of forming the antireflective grating pattern 140 is the same as in the first embodiment of the present invention, a detailed description thereof will be omitted.

Meanwhile, the transparent electrode 330 may be stacked on the entire surface of the p-type doping layer 320 including the antireflective grating pattern 140, and then the contact pad 340 may be stacked on a top surface of the transparent electrode 330 except the emission portion. In this case, since the transparent electrode 330 is stacked over the antireflective grating pattern 140, the transparent electrode 330 may have the same shape as the antireflective grating pattern 140.

Embodiment 4

Figure 17:
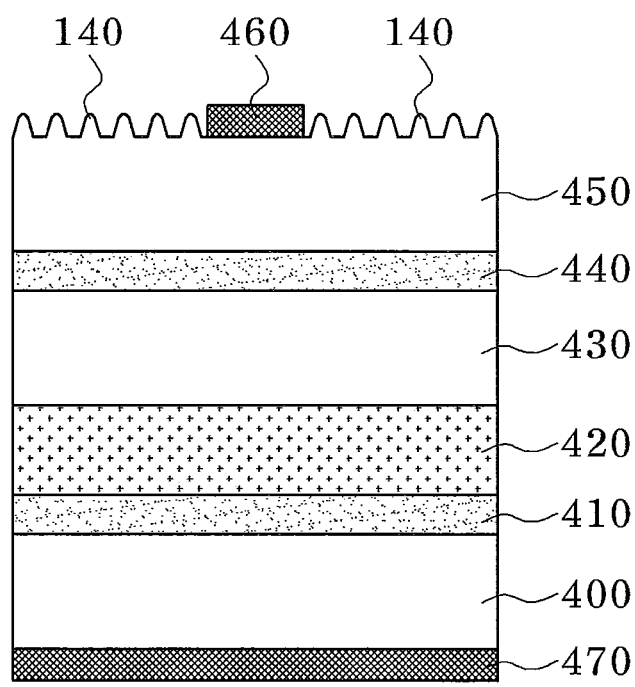
FIG. 17 is a cross-sectional view illustrating a method of fabricating an optical device integrated with an antireflective grating pattern according to a fourth exemplary embodiment of the present invention.

FIG. 17 is a cross-sectional view of an optical device integrated with an antireflective grating pattern according to a fourth exemplary embodiment of the present invention.

Referring to FIG. 17, the optical device may be a typical triple-junction solar cell, which may include a bottom cell layer 400 formed of germanium (Ge) having a bandgap of about 0.65 eV, a middle cell layer 430 disposed on the bottom cell layer 400 and formed of $In_{0.08}Ga_{0.92}As$ having a bandgap of about 1.4 eV, and a top cell layer 450 disposed on the middle cell layer 430 and formed of $In_{0.56}Ga_{0.44}P$ having a bandgap of about 1.9 eV.

In addition, the bottom cell layer 410, the middle cell layer 430, and the top cell layer 450 may be electrically connected to one another by first and second tunnel junction layers 410 and 440. A p-type upper electrode 460 may be formed on a top surface of one side of the top cell layer 450, and an n-type lower electrode 470 may be formed on a bottom surface of the bottom cell layer 400.

In particular, the antireflective grating pattern 140 formed according to the first exemplary embodiment of the present invention may be integrated on a top surface of the top cell layer 450 except a region of the p-type upper electrode 460, thereby completing the fabrication of the triple-junction solar cell, which is the optical device integrated with the antireflective grating pattern according to the fourth exemplary embodiment of the present invention.

In the present embodiment, since the method of forming the antireflective grating pattern 140 is the same as in the first embodiment of the present invention, a detailed description thereof will be omitted.

In addition, a buffer layer 420 formed of InGaAs may be further disposed between the first tunnel junction layer 410 and the middle cell layer 430.

That is, in view of absorption of a sunlight spectrum, the top cell layer 450 may absorb light in a wavelength range of about 650 nm or less, the middle cell layer 430 may absorb light in a wavelength range of about 650 to 900 nm, and the bottom cell layer 400 may absorb light in a wavelength range of about 900 to 1900 nm so that the optical device can be configured to absorb light over a wide wavelength range.

In this case, the method of fabricating the antireflective grating pattern 140 may be performed on the surface of the top cell layer 450, thereby minimizing the reflection of incident light and increasing the efficiency of the solar cell.

Embodiment 5

Figure 18:
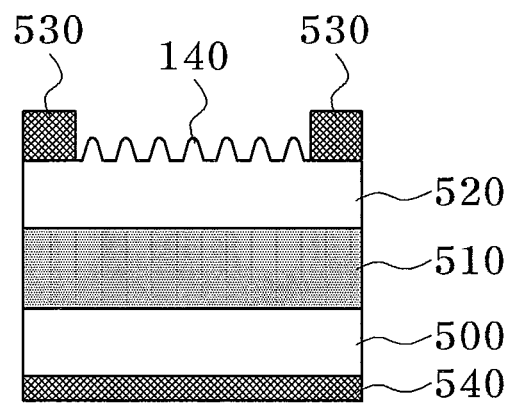
FIG. 18 is a cross-sectional view illustrating a method of fabricating an optical device integrated with an antireflective grating pattern according to a fifth exemplary embodiment of the present invention.

FIG. 18 is a cross-sectional view of an optical device integrated with an antireflective grating pattern according to a fifth exemplary embodiment of the present invention.

Referring to FIG. 18, the optical device may have a structure of a typical photodetector. For example, the fabrication of the optical device may include sequentially stacking an n-type doping layer 500, a light absorption layer 510, and a p-type doping layer 520, stacking a p-type upper electrode 530 on a top surface of the p-type doping layer 520 except a light absorption portion, and stacking an n-type lower electrode 540 on a bottom surface of the n-type doping layer 500, but the present invention is not limited thereto.

In particular, the antireflective grating pattern 140 foamed according to the first exemplary embodiment of the present invention may be integrated on a top surface of the light absorption portion of the p-type doping layer 520, thereby completing the fabrication of the optical device integrated with the antireflective grating pattern according to the fifth exemplary embodiment of the present invention.

In the present embodiment, since the method of forming the antireflective grating pattern 140 is the same as in the first embodiment of the present invention, a detailed description thereof will be omitted.

In this case, the method of fabricating the antireflective grating pattern 140 may be performed on the surface of the p-type doping layer 520, thereby minimizing the reflection of incident light and increasing the efficiency of the photodetector.

Embodiment 6

Figure 19:
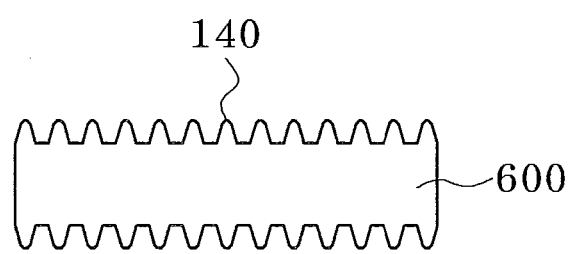
FIG. 19 is a cross-sectional view illustrating a method of fabricating an optical device integrated with an antireflective grating pattern according to a sixth exemplary embodiment of the present invention.

FIG. 19 is a cross-sectional view of an optical device integrated with an antireflective grating pattern according to a sixth exemplary embodiment of the present invention.

Referring to FIG. 19, the optical device may be a typical transparent glass 600, which may have a refractive index of about 1.5 and exhibit a transmittance of about 95% or higher in a specific wavelength range. However, in the fields of some applications, such as solar cells, a transmittance of about 99% or higher may be required over a wide wavelength range. To this end, the above-described method of fabricating the antireflective grating pattern 140 according to the first exemplary embodiment of the present invention may be employed.

That is, the antireflective grating pattern 140 formed according to the first exemplary embodiment of the present invention may be integrated on the transparent glass 600 so that a high transmittance can be obtained over a wider wavelength range. Also, the antireflective grating pattern 140 may be integrated not only on the transparent glass 600 but also under the transparent glass 600 so that a high transmittance can be obtained over a wider wavelength range.

Embodiment 7

Figure 20:
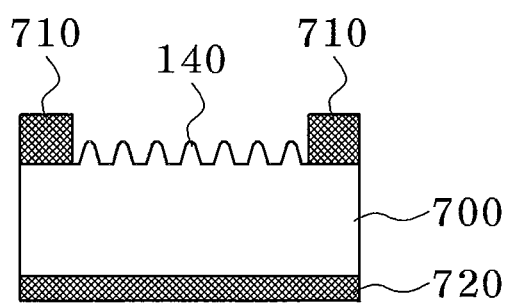
FIG. 20 is a cross-sectional view illustrating a method of fabricating an optical device integrated with an antireflective grating pattern according to a seventh exemplary embodiment of the present invention.

FIG. 20 is a cross-sectional view of an optical device integrated with an antireflective grating pattern according to a seventh exemplary embodiment of the present invention.

Referring to FIG. 20, the optical device may be a typical thin-film crystalline-silicon solar cell, which may include a crystalline silicon layer 700, an upper electrode 710 disposed on the crystalline silicon layer 700, and a reflective layer 720 disposed under the crystalline silicon layer 700 and formed of, for example, aluminum (Al). Here, the reflective layer 720 may function also as a lower electrode.

In particular, the antireflective grating pattern 140 formed according to the first exemplary embodiment of the present invention may be integrated on a top surface of the crystalline silicon layer 700 except a region of the upper electrode 710, thereby completing the fabrication of the thin-film crystalline silicon solar cell, which is the optical device integrated with the antireflective grating pattern according to the seventh exemplary embodiment of the present invention. As a result, the reflection of incident light may be minimized, and the efficiency of the solar cell may be increased.

In the present embodiment, since the method of forming the antireflective grating pattern 140 is the same as in the first embodiment of the present invention, a detailed description thereof will be omitted.

Meanwhile, a conventional thin-film crystalline silicon solar cell may include a crystalline silicon layer, a single or multiple antireflective thin layer disposed on the crystalline silicon layer, and a reflective layer disposed under the crystalline silicon layer and having an Al layer disposed on a top surface thereof. The conventional thin-film crystalline silicon solar cell may have a low reflectance only in a specific wavelength range and be vulnerable to heat.

However, since the thin-film crystalline silicon solar cell, which is the optical device integrated with the antireflective grating pattern according to the seventh exemplary embodiment of the present invention, may have a very low reflectance in a wide spectrum region as compared with the conventional single or multiple antireflective thin layer, cell efficiency may be increased, thermal and stable drawbacks caused by a conventional stack structure may be solved.

Figure 21:
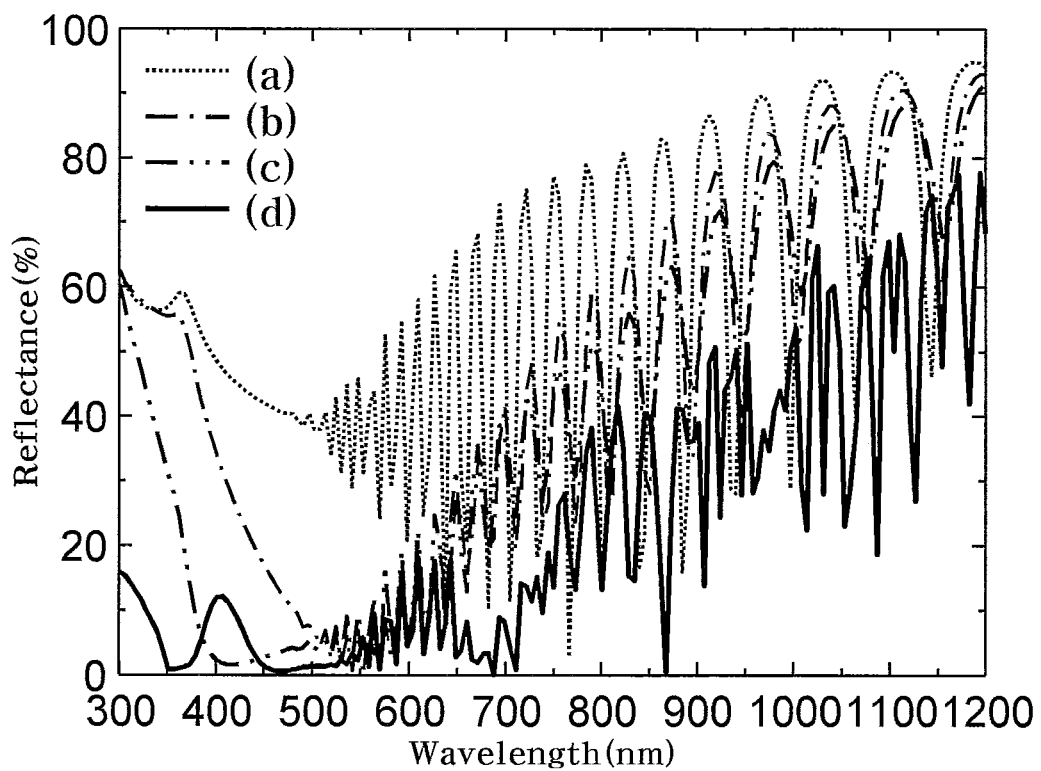
FIG. 21 is a graph showing reflectance versus wavelength in the optical device integrated with the antireflective grating pattern formed according to the seventh exemplary embodiment of the present invention.

FIGS. 21A through 21D are graphs showing reflectance versus wavelength in optical devices integrated with antireflective grating patterns formed according to the seventh exemplary embodiment of the present invention. FIG. 21A shows a case where only a crystalline silicon layer with a thickness of about 2 μm is provided. FIG. 21B shows a case where a single antireflective thin layer (SiN$_x$) is disposed on a crystalline silicon layer with a thickness of about 2 μm. FIG. 21C shows a case where a multiple antireflective thin layer formed of ZnS/MgF$_2$ is disposed on a crystalline silicon layer with a thickness of about 2 p.m. FIG. 21D shows a case where an antireflective grating pattern with a depth of about 400 nm and a period of about 400 nm according to the seventh exemplary embodiment of the present invention is disposed on a crystalline silicon layer with a thickness of about 2 μm. From FIGS. 21A through 21D, it can be confirmed that the optical device of FIG. 21D has far lower reflection characteristics than the optical devices of FIGS. 21A through 21C.

FIGS. 22A through 22D are graphs showing cell efficiency versus period of an antireflective grating pattern in optical devices integrated with antireflective grating patterns according to the seventh exemplary embodiment of the present invention. From FIGS. 22A through 22D, it can be seen that the highest cell efficiency may be obtained when the period of the antireflective grating pattern ranges from about 300 to 500 nm (specifically, about 400 nm), and be about 25% higher than in a conventional case (a) where a single or multiple antireflective thin layer is provided.

Figure 22:
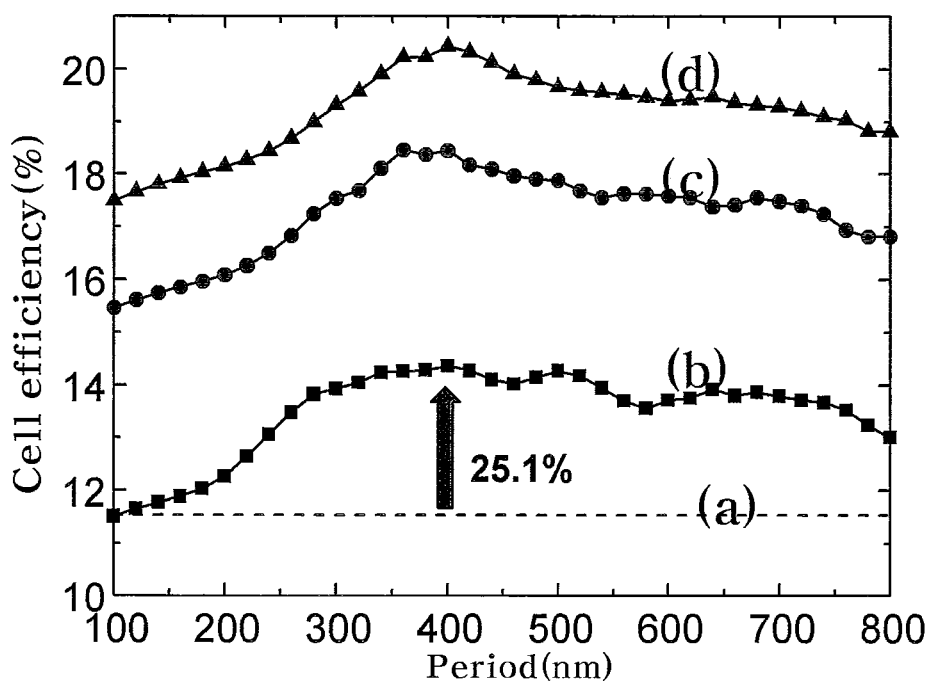
FIG. 22 is a graph showing cell efficiency versus period of the antireflective grating pattern in the optical device integrated with the antireflective grating pattern formed according to the seventh exemplary embodiment of the present invention.

FIGS. 22B, 22C, and 22D show respective cases where a crystalline silicon layer is formed to a thickness of about 2 μm, 5 μm, and 8 μm in optical devices integrated with antireflective grating patterns formed according to the seventh exemplary embodiment of the present invention.

Accordingly, it can be inferred that when the antireflective grating pattern has a small period, absorption efficiency is high in a low wavelength range, while when the antireflective grating pattern has a great period, absorption efficiency is high in a high wavelength range. That is, the absorption efficiency is closely associated with the period of the antireflective grating pattern. When the antireflective grating pattern applied to the seventh exemplary embodiment of the present invention has a period of about 400 nm, the optical device according to the seventh exemplary embodiment of the present invention may generally have high absorption characteristics.

Meanwhile, cell efficiency η applied to FIGS. 22A through 22D is expressed by Equation 3:

$$\eta = J_{sc} V_{oc} \Gamma_f / P_{in} \quad (3),$$

wherein $J_{sc}$ denotes a short current density, $V_{oc}$ denotes an open circuit voltage, $\Gamma_f$ denotes a fill factor, and $P_{in}$ denotes a total input power. Also, an collection efficiency of about 85% and an shadow effect of about 5% caused by electrodes were considered, and calculation of absorption efficiency required for obtaining the short current density was performed in a wavelength range of about 300 to 1200 nm.

A detailed calculation of the cell efficiency η may be understood with reference to Reference document 1 (S. M. Sze, Physics of semiconductor devices $2^{nd}$ ed., (NJ, Wiely, 1981), chap. 14.) and Reference document 2 (L. C. Kimerling et. al., IEEE Trans. Electron Devices 54, 1926 (2007)).

Figure 23:
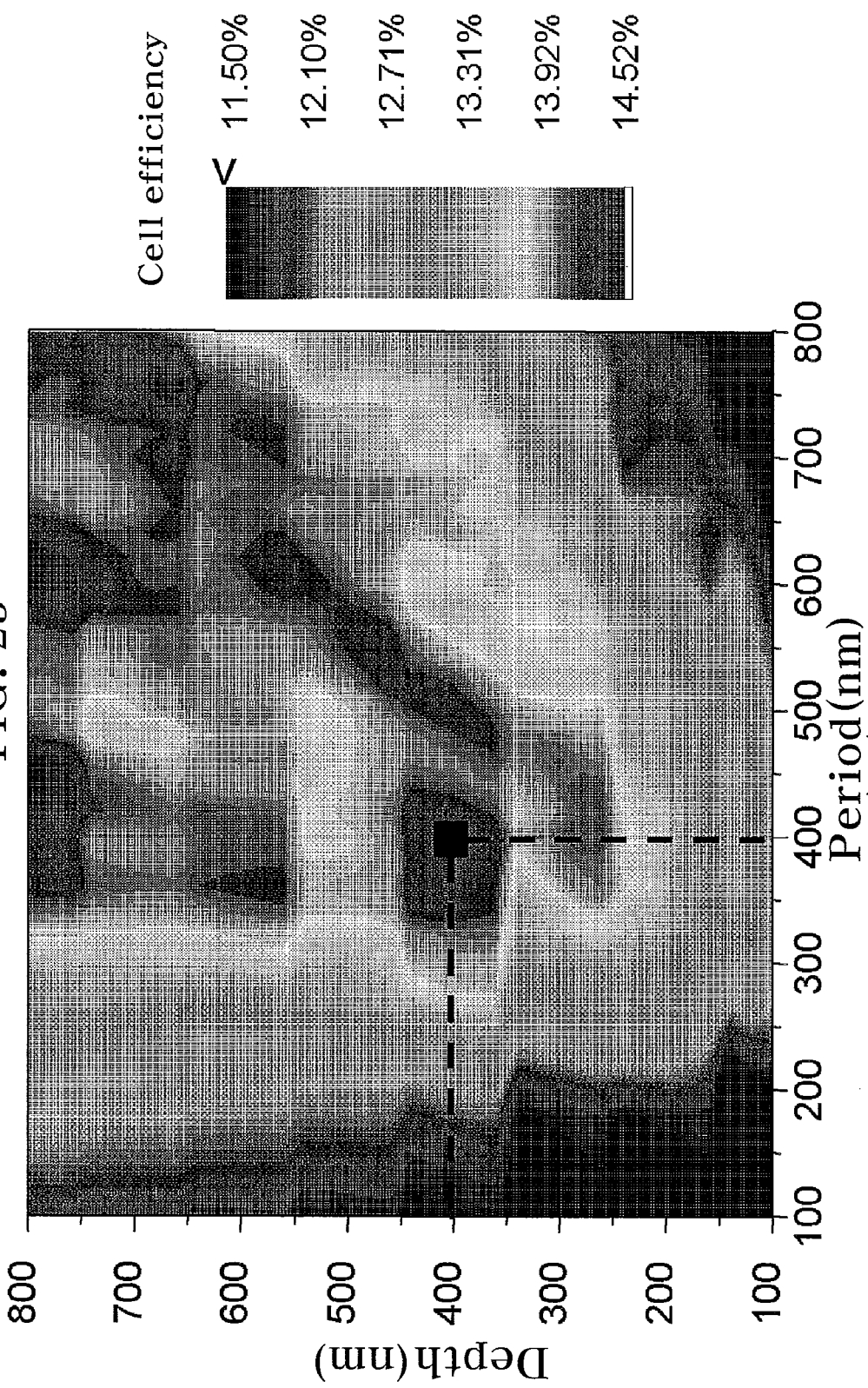
FIG. 23 is a diagram showing cell efficiency versus period and depth of the antireflective grating pattern in the optical device integrated with the antireflective grating pattern according to the seventh exemplary embodiment of the present invention.

FIG. 23 is a graph showing cell efficiency versus period and depth of the antireflective grating pattern in the optical device integrated with the antireflective grating pattern according to the seventh exemplary embodiment of the present invention. As the depth of the antireflective grating pattern increases, the refractive index of the antireflective grating pattern gradually varies so that cell efficiency can increase. However, since an actual process may be complicated, it can be confirmed that the most appropriate cell efficiency may be obtained when the depth of the antireflective grating pattern ranges from about 300 to 500 nm (specifically, about 400 nm) and the period of the antireflective grating pattern ranges from about 300 to 500 nm (specifically, about 400 nm).

According to the method of fabricating an antireflective SWG pattern as described above, a wedge-type or parabola-type antireflective SWG pattern having a pointed tip may be formed using a hologram lithography process, a reflow process, and a pattern transfer process. Therefore, a fabrication process can be simple, and the reflected amount of light caused by a difference in refractive index between the air and a semiconductor material can be minimized. In addition, an antireflective SWG structure can be fabricated at low cost, and integration efficiency can be maximized when the antireflective SWG structure is applied to an optical device, such as a solar cell, a photodetector, a light emitting device, or a transparent glass.

Furthermore, according to the present invention, the height of an antireflective SWG structure may be controlled by adjusting, for example, a gas amount, a pressure, and a driving voltage, during a dry etching process so that a desired aspect ratio can be easily obtained.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A method of fabricating an optical device integrated with an antireflective grating pattern, comprising:
    sequentially stacking an n-type doping layer, an active layer, and a p-type doping layer, stacking a p-type upper electrode on a top surface of the p-type doping layer except an emission portion, and stacking an n-type lower electrode on a bottom surface of the n-type doping layer; and
    forming a wedge-type or parabola-type antireflective subwavelength grating (SWG) pattern having a pointed tip only on a top surface of the emission portion of the p-type doping layer by:
        forming a photoresist (PR) pattern on the top surface of the emission portion of the p-type doping layer using a hologram lithography process;
        forming a PR lens pattern having a predetermined radius of curvature by reflowing the PR pattern by applying heat to the PR pattern; and
        etching the PR lens pattern to form the wedge-type or parabola-type antireflective subwavelength grating (SWG) pattern,
    wherein each of a period and depth of the antireflective subwavelength grating (SWG) pattern ranges from about 300 to 500 nm.

2. A method of fabricating an optical device integrated with an antireflective grating pattern, comprising:
    sequentially stacking an n-type doping layer, an active layer, and a p-type doping layer and forming a wedge-type or parabola-type antireflective subwavelength grating (SWG) pattern having a pointed tip on a top surface of an emission portion of the p-type doping layer by: forming a photoresist (PR) pattern on the top surface of the emission portion of the p-type doping layer using a hologram lithography process; forming a PR lens pattern having a predetermined radius of curvature by reflowing the PR pattern by applying heat to the PR pattern; and etching the PR lens pattern to form the wedge-type or parabola-type antireflective subwavelength grating (SWG) pattern; and
    stacking a transparent electrode on the entire surface of the p-type doping layer including the antireflective grating pattern, stacking a contact pad on a top surface of the transparent electrode except the emission portion, and stacking an n-type lower electrode on a bottom surface of the n-type doping layer,
    wherein the transparent electrode has a shape that corresponds to a shape of the antireflective subwavelength grating (SWG) pattern, and
    wherein each of a period and depth of the antireflective subwavelength grating (SWG) pattern ranges from about 300 to 500 nm.

3. A method of fabricating an optical device integrated with an antireflective grating pattern, comprising:
    sequentially stacking a bottom cell layer, a middle cell layer, and a top cell layer, stacking a p-type upper electrode on a top surface of one side of the top cell layer, and stacking an n-type lower electrode on a bottom surface of the bottom cell layer; and
    forming a wedge-type or parabola-type antireflective subwavelength grating (SWG) pattern having a pointed tip on a top surface of the top cell layer except a region of the p-type upper electrode by:
        forming a photoresist (PR) pattern on the top surface of the top cell layer except the region of the p-type upper electrode using a hologram lithography process;
        forming a PR lens pattern having a predetermined radius of curvature by reflowing the PR pattern by applying heat to the PR pattern; and
        etching the PR lens pattern to form the wedge-type or parabola-type antireflective subwavelength grating (SWG) pattern,
    wherein each of a period and depth of the antireflective subwavelength grating (SWG) pattern ranges from about 300 to 500 nm.

4. The method of claim 3, wherein the bottom cell layer and the middle cell layer are connected to each other by a first tunnel junction layer, and the middle cell layer and the top cell layer are connected to each other by a second tunnel junction layer.

5. The method of claim 4, further comprising a buffer layer disposed between the first tunnel junction layer and the middle cell layer.

6. A method of fabricating an optical device integrated with an antireflective grating pattern, comprising:
    sequentially stacking an n-type doping layer, a light absorption layer, and a p-type doing layer, stacking a p-type upper electrode on a top surface of the p-type doping layer except a light absorption portion, and stacking an n-type lower electrode on a bottom surface of the n-type doping layer; and
    forming a wedge-type or parabola-type antireflective subwavelength grating (SWG) pattern having a pointed tip only on a top surface of the light absorption portion of the p-type doping layer by:
        forming a photoresist (PR) pattern on the top surface of the light absorption portion of the p-type doping layer using a hologram lithography process;
        forming a PR lens pattern having a predetermined radius of curvature by reflowing the PR pattern by applying heat to the PR pattern; and
        etching the PR lens pattern to form the wedge-type or parabola-type antireflective subwavelength grating (SWG) pattern,
    wherein each of a period and depth of the antireflective subwavelength grating (SWG) pattern ranges from about 300 to 500 nm.

7. A method of fabricating an optical device integrated with an antireflective grating pattern, comprising:

stacking an upper electrode on a top surface of one side of a crystalline silicon layer and stacking a reflective layer on a bottom surface of the crystalline silicon layer; and forming a wedge-type or parabola-type antireflective subwavelength grating (SWG) pattern having a pointed tip on a top surface of the crystalline silicon layer except a region of the upper electrode by:

forming a photoresist (PR) pattern on the top surface of the crystalline silicon layer except a region of the upper electrode using a hologram lithography process;

forming a PR lens pattern having a predetermined radius of curvature by reflowing the PR pattern by applying heat to the PR pattern; and etching the PR lens pattern to form the wedge-type or parabola-type antireflective subwavelength grating (SWG) pattern wherein each of a period and depth of the antireflective subwavelength grating (SWG) pattern ranges from about 300 to 500 nm.

\* \* \* \* \*